United States Patent
Hatakenaka

(10) Patent No.: US 10,012,912 B2
(45) Date of Patent: Jul. 3, 2018

(54) EXPOSURE METHOD, EXPOSURE APPARATUS, AND PHOTOMASK

(71) Applicant: FUJITSU SEMICONDUCTOR LIMITED, Yokohama-shi, Kanagawa (JP)

(72) Inventor: Kimie Hatakenaka, Mie (JP)

(73) Assignee: FUJITSU SEMICONDUCTOR LIMITED, Yokohama (JP)

(*) Notice: Subject to any disclaimer, the term of this patent is extended or adjusted under 35 U.S.C. 154(b) by 1435 days.

(21) Appl. No.: 13/905,529

(22) Filed: May 30, 2013

(65) Prior Publication Data

US 2013/0335719 A1 Dec. 19, 2013

(30) Foreign Application Priority Data

Jun. 15, 2012 (JP) ................. 2012-136121

(51) Int. Cl.
*G03B 27/52* (2006.01)
*G03F 7/20* (2006.01)

(52) U.S. Cl.
CPC ........ *G03F 7/70641* (2013.01); *G03F 7/2022* (2013.01); *G03F 7/70125* (2013.01)

(58) Field of Classification Search
CPC . G03F 7/70641; G03F 7/2022; G03F 7/70125
USPC ........................................... 355/55
See application file for complete search history.

(56) References Cited

U.S. PATENT DOCUMENTS

| 5,793,471 A | 8/1998 | Kanda et al. |
| 2005/0286052 A1 | 12/2005 | Huggins et al. |
| 2010/0203433 A1 | 8/2010 | Murata |

FOREIGN PATENT DOCUMENTS

| CN | 1973371 A | 5/2007 |
| CN | 101354528 A | 1/2009 |
| JP | 5-304075 A | 11/1993 |
| JP | 9-22863 A | 1/1997 |
| JP | 2000-82649 A | 3/2000 |
| JP | 2001-85309 A | 3/2001 |
| JP | 2009-88549 A | 4/2009 |
| JP | 2010-206175 A | 9/2010 |

OTHER PUBLICATIONS

Chinese Office Action dated Jan. 20, 2015, issued in corresponding CN Patent Application No. 201310236592.2 with English translation (9 pages).
Office Action dated Jan. 26, 2016, issued in counterpart Japanese Patent Application No. 2012-136121, with English translation. (7 pages).

*Primary Examiner* — Peter B Kim

(74) *Attorney, Agent, or Firm* — Westerman, Hattori, Daniels & Adrian, LLP

(57) ABSTRACT

An exposure method includes: exposing, with a photomask including a shot pattern including chip patterns arranged therein, a plurality of the shot patterns onto a wafer as a first pattern; aligning the photomask on the wafer so that a first region of the shot pattern overlaps the first pattern, a second region other than the first region of the shot pattern is outside the first pattern, and chip patterns are continuously arranged in the first pattern and the second region; adjusting focus on the wafer, with the photomask having been aligned on the wafer; and shielding the first region from light and exposing a pattern of the second region onto the wafer as a second pattern.

8 Claims, 13 Drawing Sheets

EXPOSURE METHOD, EXPOSURE APPARATUS, AND PHOTOMASK

CROSS-REFERENCE TO RELATED APPLICATION

This application is based upon and claims the benefit of priority of the prior Japanese Patent Application No. 2012-136121, filed on Jun. 15, 2012, the entire contents of which are incorporated herein by reference.

FIELD

A certain aspect of embodiments described herein relates to at exposure method, an exposure apparatus, and a photomask.

BACKGROUND

A process for manufacturing an electronic device such as a semiconductor element includes an exposure step. In the exposure step, a wafer is coated with photoresist, and then an exposure apparatus transfers a pattern of a photomask to the photoresist. A reduction exposure apparatus, which reduces and exposes the pattern of the photomask onto the wafer, has been known as the exposure apparatus. A stepper that exposes the pattern of the photomask in one-shot and a scanner that scans an exposure region have been known as the reduction exposure apparatus. A reticle has been known as a photomask.

When an area exposed by the exposure apparatus includes an area outside of the wafer, a first method, disclosed in Japanese Laid-open Patent Publication No. 5-304075, obtains focus data within the wafer, and exposes the area including the area outside of the wafer. A second method, disclosed in Japanese Laid-open Patent Publication No. 2009-88549, uses a photomask having two or more regions, and exposes a center portion and an edge portion of the wafer with proper regions of the photomask. A third method, disclosed in Japanese Laid-open Patent Publication Nos. 2000-82649 and 9-22863, shields a region in which a lack of a shot pattern at the edge portion of the wafer occurs from light to prevent the lack of the shot pattern at the edge portion of the wafer.

SUMMARY

According to an aspect of the present invention, there is provided an exposure method including: exposing, with a photomask including a shot pattern including chip patterns arranged therein, a plurality of the shot patterns onto a wafer as a first pattern; aligning the photomask on the wafer so that a first region of the shot pattern overlaps the first pattern, a second region other than the first region of the shot pattern is outside the first pattern, and chip patterns are continuously arranged in the first pattern and the second region; adjusting focus on the wafer, with the photomask having been aligned on the wafer; and shielding the first region from light and exposing a pattern of the second region onto the wafer as a second pattern.

According to an aspect of the present invention, there is provided a photomask including: identical chip patterns arranged in at least one of a first direction and a second direction intersecting with the first direction; a first scribe pattern arranged between the chip patterns and having a monitor pattern formed therein; and a second scribe pattern without the monitor pattern formed therein.

According, to an aspect of the present invention, there is provided an exposure apparatus including: an exposure unit that exposes a pattern onto a wafer with a photomask including a shot pattern including chip patterns arranged therein; an adjustment unit that adjusts focus on the wafer; and a controller that controls the exposure unit to expose a plurality of the shot patterns onto the wafer as a first pattern, the adjustment unit to adjust the focus, with the photomask having been aligned on the wafer, so that a first region of the shot pattern overlaps the first pattern, a second region other than the first region of the shot pattern is outside the first pattern, and chip patterns are continuously arranged in the first pattern and the second region, and the exposure unit to shield the first region from light and expose a pattern of the second region onto the wafer as a second pattern.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

The first method moves the wafer between the acquisition of the focus data and the exposure, and thus may cause a miss focus. The second method fails to make the region of the photomask large in exposing the center portion of the wafer. This reduces throughput. The third method can suppress the lack of the shot pattern at the edge portion of the wafer, but decreases focus accuracy at the edge portion of the wafer.

Figure 1:
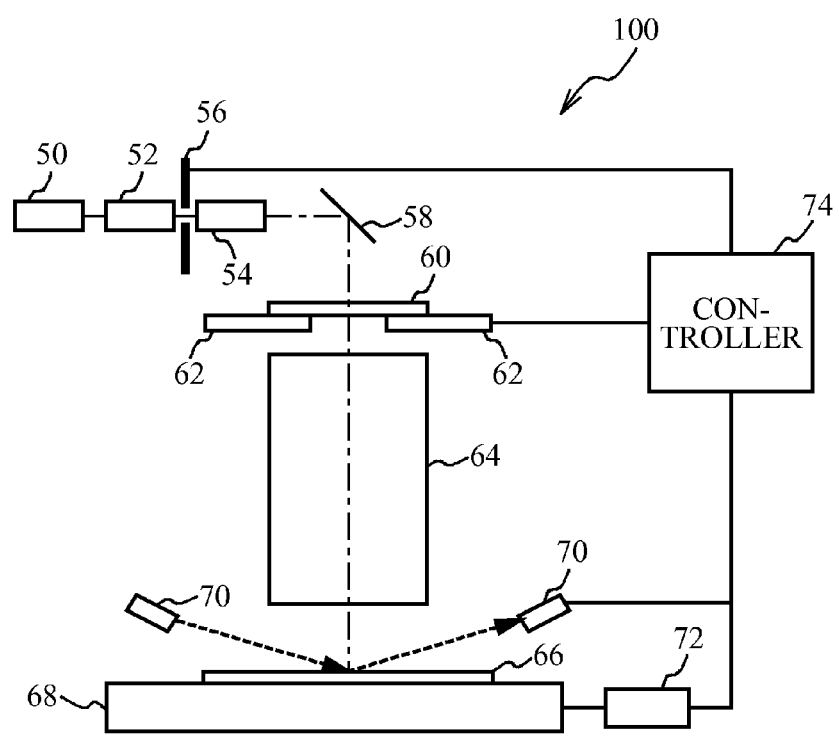
FIG. 1 is a block diagram of an exposure apparatus.

A description will first be given of a reduction exposure apparatus as an exemplary exposure apparatus. FIG. 1 is a block diagram of an exposure apparatus. An exposure apparatus 100 includes a light source 50, an illumination optical system 52, a relay optical system 54, a blind 56, a mirror 58, a reticle stage 62, a projection optical system 64, a wafer stage 68, an autofocus sensor 70, a drive system 72, and a controller 74. The light source 50 is a KrF or ArF laser for example. The illumination optical system 52 focuses a light beam emitted from the light source 50 at the blind 56 to form an image. The illumination optical system 52 converts the light beam emitted from the Tight source 50 into a uniform exposure illumination light. The illumination light is blocked by the blind 56 to expose a part of a reticle 60. The relay optical system 54 forms the image of the blind 56 at the reticle 60. The mirror 58 reflects the light beam transmitted through the relay optical system 54. As described above, the illumination light transmitted through the blind 56 is transmitted through the relay optical system 54, is reflected by the mirror 58, and illuminates the reticle 60. The reticle stage 62 supports the reticle 60. The projection optical system 64 forms an image of the reticle 60 onto a wafer 66. The wafer stage 68 supports the wafer 66. The autofocus sensor 70 detects a focus position. The drive system 72 drives the wafer stage 68. The controller 74 controls the blind 56, the reticle stage 62, and the drive system 72. The controller 74 is a processor such as a microprocessor for example. For example, the light source 50, the illumination optical system 52, the relay optical system 54, the mirror 58, the reticle stage 62, the projection optical system 64, the wafer stage 68, and the drive system 72 function as an exposure unit. Moreover, the wafer stage 68, the autofocus sensor 70, and the drive system 72 function as an adjustment unit.

Figure 2A:
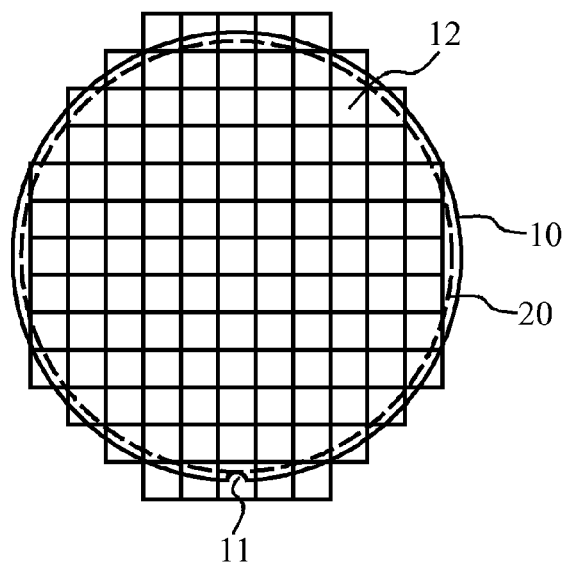
FIG. 2A illustrates an arrangement of shot patterns in a wafer.
Figure 2B:
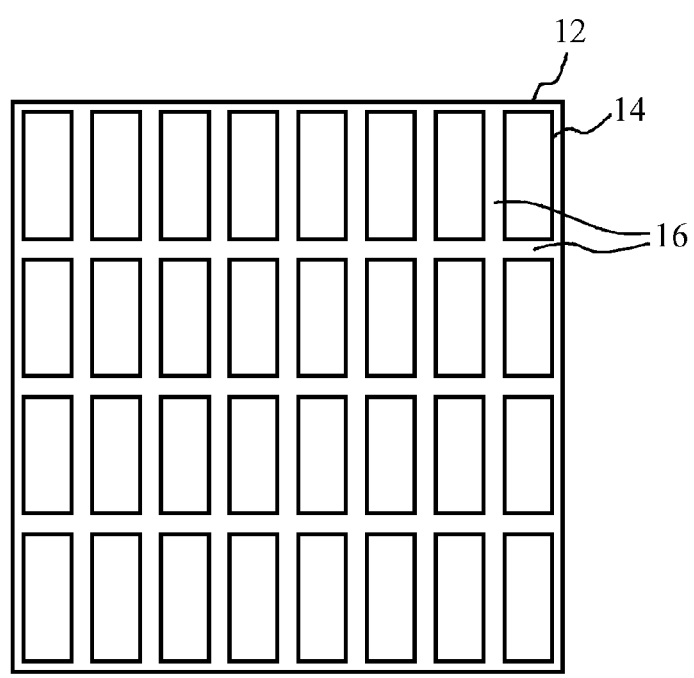
FIG. 2B illustrates an arrangement of chip patterns in the shot pattern.

FIG. 2A illustrates an arrangement of shot patterns in the wafer, and FIG. 2B illustrates an arrangement of chip patterns in the shot pattern. As illustrated in FIG. 2A, a notch 11 for indicating a crystal orientation of a wafer 10 is formed in the wafer 10. The wafer 10 has a diameter of 12, 8, or 6 inches for example. The diameter of the wafer 10 is not limited to the above ones. An effective region 20 is located within the wafer 10. The effective region 20 is a region in which a physical property of a material (e.g. silicon) and flatness of a top surface in the wafer 10 are assured. Chips fabricated within the effective region 20 are handled as products, whereas chips fabricated outside the effective region 20 are not guaranteed performance of the product. An outer periphery of the effective region 20 is a few millimeters inside an outer periphery of the wafer 10. Shot patterns 12 are arranged in an X direction (first direction) and a Y direction (second direction intersecting with the first direction) the wafer 10. The shot patterns 12 are also located outside the effective region 20 at an edge portion of the wafer 10. FIG. 2A illustrates patterns exposed onto the wafer 10, and illustrates even the shot patterns 12 outside the wafer 10.

As illustrated in FIG. 2B, chip patterns 14 are arranged in the X direction and the Y direction in the shot pattern 12. It is sufficient if the chip patterns 14 are arranged in at least one of the X direction and the V direction. The chip patterns 14 are identical chip patterns, and have the same chip size for example. Scribe patterns 16 are formed between the chip patterns 14. A scribe formed by the scribe pattern 16 is a region for cutting out chips. The shot pattern 12 illustrated in FIG. 2B is drawn on photomask (e.g. reticle). The exposure apparatus 100 transfers the shot pattern 12 of the reticle 60 to the photoresist on the wafer 10. The above process forms the shot pattern 12 illustrated in FIG. 2B on the wafer 10. The shot pattern 12 has a size of 25 min×25 mm at maximum, or 25 mm×34 mm at maximum for example. The size of the shot pattern 12 is not limited to the above size. The chip pattern 14 has a size of a few millimeters×a few millimeters for example, and the size is determined in accordance with a circuit site of a device to be fabricated. The scribe pattern 16 has a width of 40 to 100 μm for example. The above sizes are sizes on the wafer 10. When the reduction exposure apparatus is used, the size on the reticle 60 is larger than the size on the wafer 10 in accordance with a reduction ratio.

Figure 3:
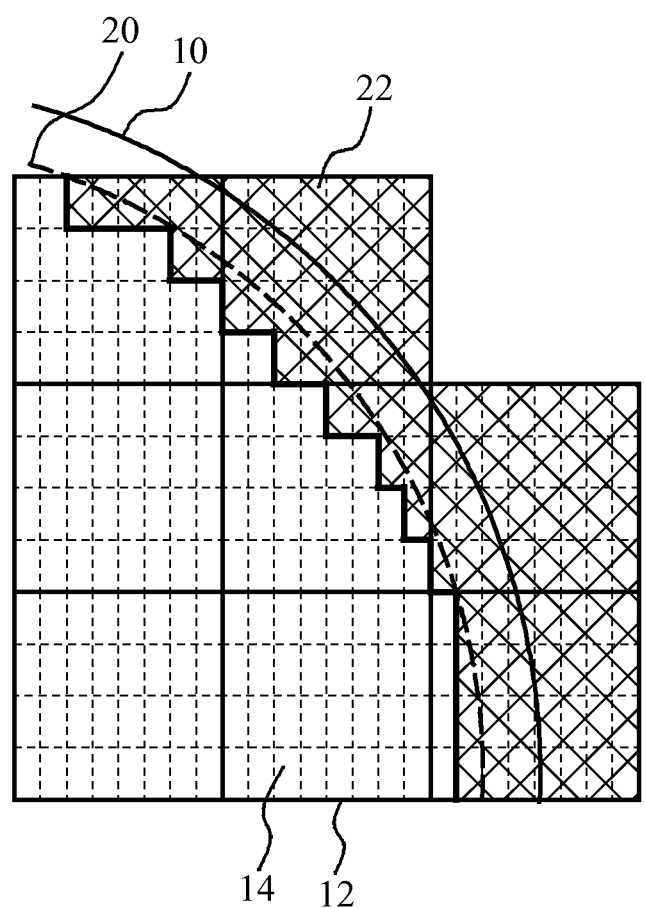
FIG. 3 is a plan view of patterns at an edge portion of the wafer.

FIG. 3 is a plan view of patterns at the edge portion of the wafer. As illustrated in FIG. 3, the shot patterns 12 are arranged in the X direction and the Y direction. The shot patterns 12 do not overlap each other, and include the chip patterns 14 arranged at regular intervals. A region 22 formed by the chip patterns 14 including a region outside the effective region 20 is crosshatched. FIG. 3 illustrates patterns exposed onto the wafer 10, and illustrates even the shot patterns 12 and the chip patterns 14 outside the wafer 10. The same applies to the drawings hereinafter.

Figure 4A:
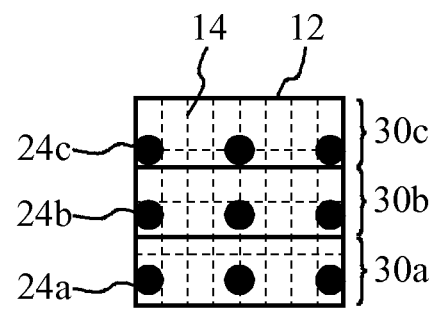
FIG. 4A through FIG. 4C are plan views illustrating a method for adjusting focus before exposing the shot pattern.
Figure 4B:
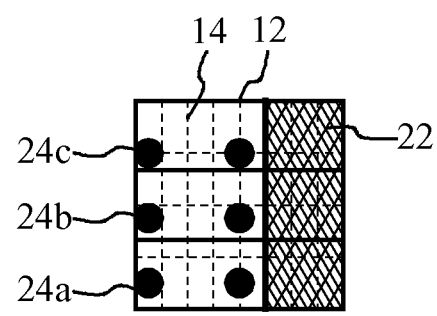
Figure 4C:
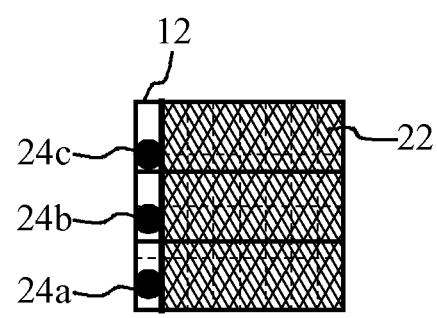

FIG. 4A through FIG. 4C are plan views illustrating a method for adjusting focus before exposing the shot pattern. As illustrated in FIG. 4A, regions 30a through 30c are slit regions when the exposure apparatus is a scanner. For example, the exposure apparatus 100 exposes the regions 30a, 30b, and 30c in this order. Sensed points 24a through 24c are points of which a focus condition is detected by the autofocus sensor 70. The sensed points 24a through 24c are arranged in the X direction and the Y direction in the shot pattern 12. The 3×3 sensed points 24a through 24c are illustrated, but the number of the sensed points 24a through 24c are not limited to this. The autofocus sensor 70 detects the focus condition of the sensed points 24a through 24c before the exposure apparatus 100 performs exposure. The controller 74 adjusts focus on the wafer 66 based on detection results of the autofocus sensor 70. To adjust the focus, total level and a tilt of the wafer 66 are adjusted by changing total level of the wafer stage 68 and a tilt, of the wafer stage 68 with the drive system 72.

As illustrated in FIG. 4A, when the whole of the shot pattern 12 is within the effective region, the controller 74 can adjust the focus on the wafer with detection results of all the sensed points 24a through 24c. As illustrated in FIG. 4B, when half or more than half of the shot pattern 12 is within the effective region and the remaining region 22 is outside the effective region, the focus condition can not be detected in the region 22. Therefore, the controller 74 adjusts the focus on the wafer 10 with detection results of a pan of the sensed points 24a through 24c. Focusing accuracy deteriorates because the number of the sensed points 24a through 24c decreases. However, if effective sensed points 24 exist in both the X direction and the Y direction, the focus can be adjusted. As illustrated in FIG. 4C, when most of the shot pattern 12 is in the region 22 outside the effective region in the X direction, the number of the effective sensed points 24 in the X direction is only one. Therefore, focusing and leveling of the wafer 10 are difficult. The leveling of the wafer 10 in the X direction is especially difficult. As described above, when the number of the effective sensed points 24a through 24c is one or less in at least one of the X direction and the Y direction, the focusing and the leveling of the wafer 10 are difficult.

Figure 5:
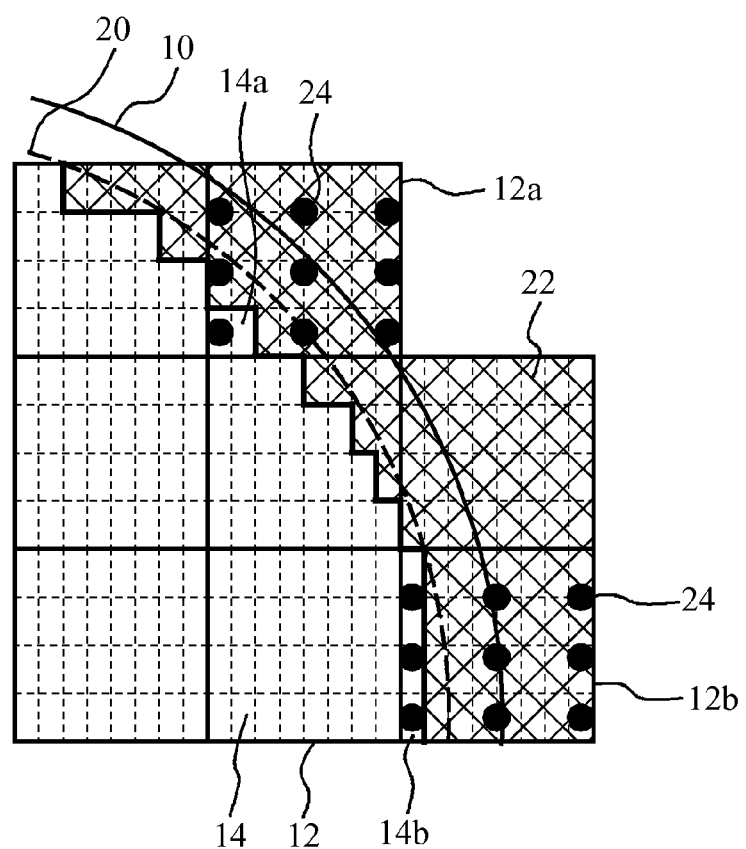
FIG. 5 is a diagram that additionally illustrates sensed points in the patterns illustrated in FIG. 3.

FIG. 5 is a diagram that additionally illustrates sensed points in the patterns illustrated in FIG. 3. As illustrated in FIG. 5, a shot pattern 12a has chip patterns 14a within the effective region 20, and a shot pattern 12b has chip patterns 14b within the effective region 20. However, the number of sensed points 24 within the effective region 20 is one, or three. Thus, when the shot pattern 12a and the shot pattern 12b are exposed, the leveling is difficult, if the chip patterns 14a and 14b fail to be exposed, the number of chips obtained from the wafer 10 decreases, and a chip yield decreases. A description will now be given of embodiments solving the above problems.

First Embodiment

Figure 6A:
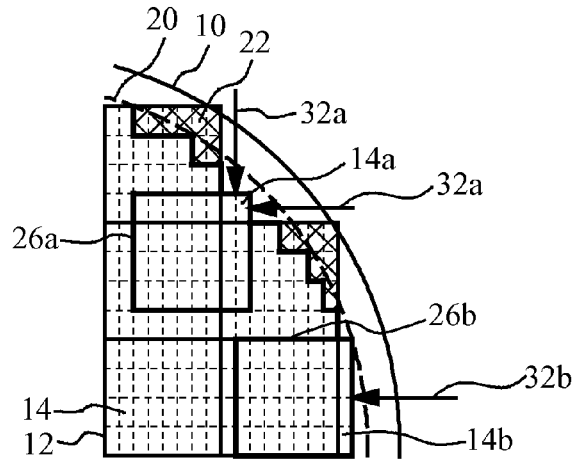
FIG. 6A through FIG. 6C are diagrams illustrating an exposure method in accordance with a first embodiment.
Figure 6B:
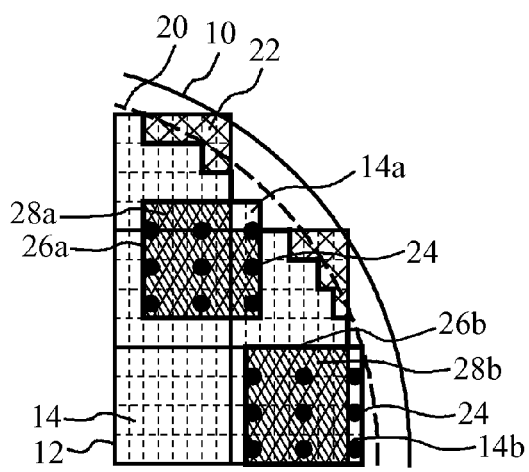
Figure 6C:
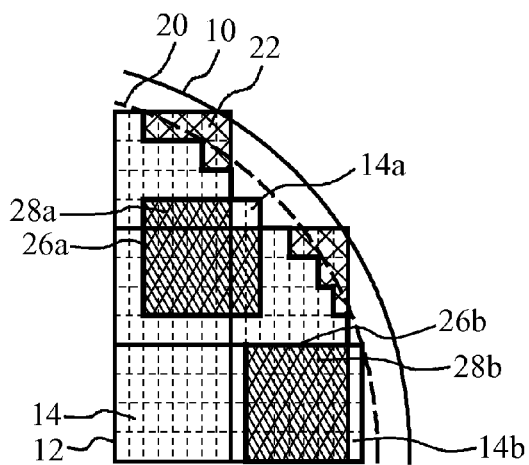

FIG. 6A through FIG. 6C are diagrams illustrating an exposure method in accordance with a first embodiment. As illustrated in FIG. 6A, referred to as a first pattern is the shot patterns 12 that are exposed so that the chip patterns 14 within the shot patterns 12 do not overlap each other. When the chip patterns 14a and 14b are exposed, shot patterns 26a and 26b are shifted so that a part of them overlaps the first pattern. For example, the shot patterns 26a and 26b are shifted toward the inside of the wafer 10 so that chip patterns other than the chip patterns 14a and 14b within the effective region 20 overlap the first pattern. For example, the shot pattern 26a is shifted three-chip downward and six-chip leftward as illustrated with an arrow 32a. The shot pattern 26b is shifted seven-chip leftward as illustrated with an arrow 32b. The shot patterns 26a and 26b are shifted by moving the wafer stage 68.

Regions overlapping the first pattern are referred to as first regions 28a and 28b in the shot patterns 26a and 26b respectively. The region other than the first region is referred to as a second region. The first pattern and the second region are arranged so that the chip patterns 14 are arranged at regular intervals. In addition, a boundary between the first pattern and the second region is located in the scribe pattern 16. This is because, in the scribe pattern 16, exposure displacement in exposing the first pattern and the second region is small, the movement accuracy of the blind 56 is high, and an effect of the light from an edge of the blind 56 is small. The second region includes the chip patterns 14a and 14b within the effective region 20. In addition, the first regions 28a and 28b include chip patterns within the effective region 20. For example, the effective region 20 includes the first regions 28a and 28b.

As illustrated in FIG. 6B, the first regions 28a and 28b in the shot patterns 26a and 26b are shielded by the blind 56. The focus condition is detected at the sensed points 24 within the shot patterns 26a and 26b. The focusing and the leveling are performed. As illustrated in FIG. 6C, exposure is performed, with the first regions 28a and 28b in the shot patterns 26a and 26b shielded by the blind 56. The reason why the first regions 28a and 28b are shielded from light is to prevent the first regions 28a and 28b from being, exposed twice. If exposed twice, they are overexposed. In addition, patterns are slightly displaced by two-time exposure.

In the description for FIG. 6A through FIG. 6C, the shot patterns 26a and 26b are processed simultaneously, but the process described in FIG. 6A through FIG. 6C may be executed to the shot patterns 26a first. Then, the process described in FIG. 6A through FIG. 6C may be executed to the shot pattern 26b. As described above, the focus condition is detected within the effective region 20 even in the shot patterns 26a and 26b at the edge portion of the wafer 10, and thus focusing and leveling accuracy can be improved.

Figure 7:
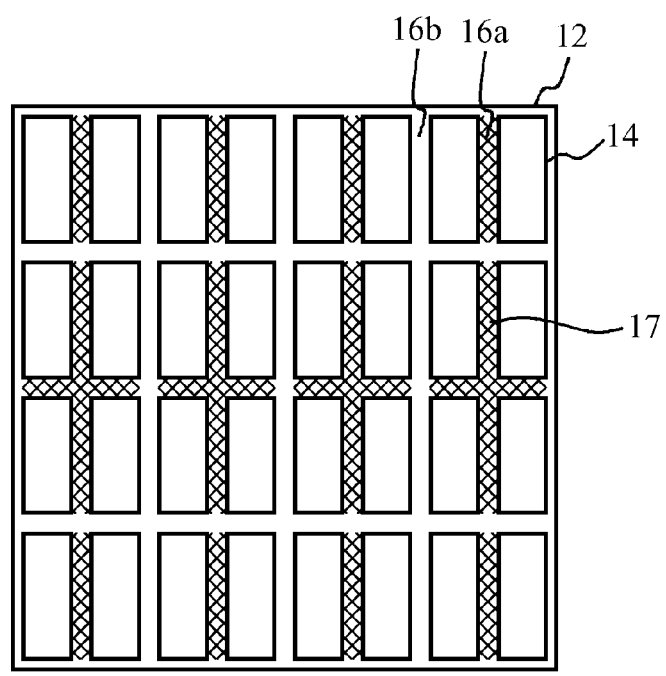
FIG. 7 is a diagram illustrating a shot pattern.

A description will now be given of a first variation of the first embodiment that forms a monitor pattern in the scribe pattern. FIG. 7 is a diagram illustrating a shot pattern. As illustrated in FIG. 7, monitor patterns 17 are formed in the scribe patterns 16. Regions with the monitor patterns 17 formed therein are illustrated with cross-hatching. The monitor pattern 17 is a pattern that is used to inspect electrical characteristics, a film thickness of a thin film, and a depth and dimension of an etching, and is an alignment mark. The monitor patterns 17 are formed in a scribe pattern 16a, but the monitor patterns 17 are not formed in a scribe pattern 16b. Movement accuracy of the blind 56 is unfavorable. In addition, light leaks from the blind 56 around the blind 56. The light from the blind 56 may cause the monitor patterns 17 not to be normally exposed. Thus, the monitor patterns 17 are preferably not thrilled in the scribe pattern 16 in which the boundary between the first pattern and the second region (i.e. the boundary shielded from light by the blind 56) is located.

Figure 8A:
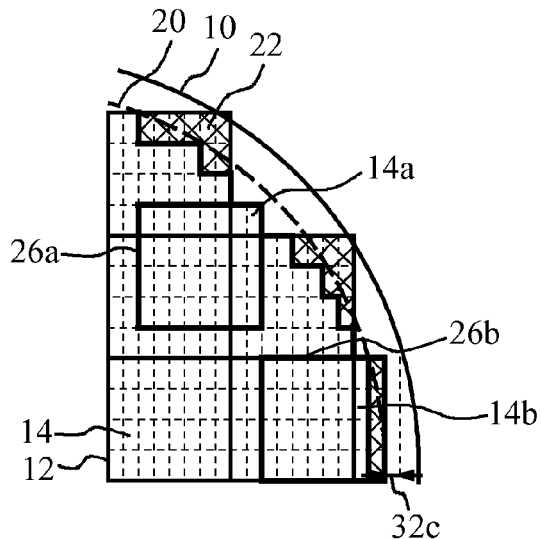
FIG. 8A through FIG. 8C are diagrams illustrating an exposure method in accordance with a first variation of the first embodiment.
Figure 8B:
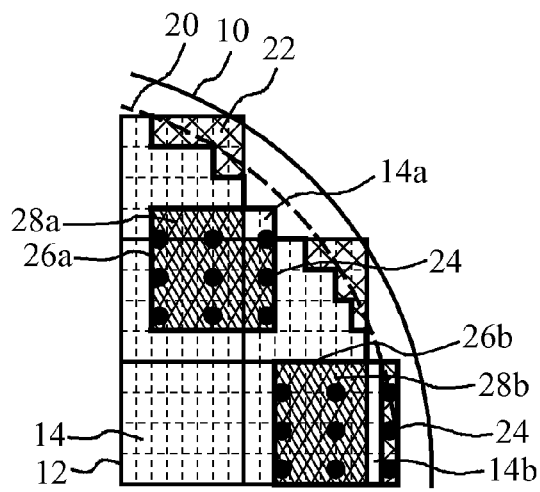
Figure 8C:
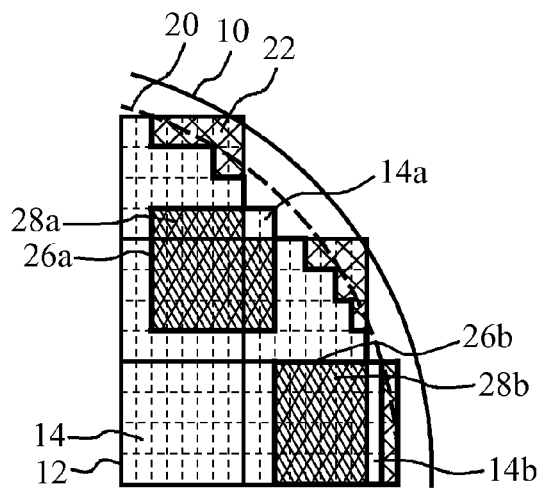

FIG. 8A through FIG. 8C are diagrams illustrating an exposure method of the first variation of the first embodiment. As illustrated in FIG. 8A, when the shot pattern illustrated in FIG. 7 is used and the shot pattern 26b is arranged as illustrated in FIG. 6A, the boundary between the first pattern and the second region is located in the scribe pattern 16a with the monitor patterns 17 formed therein. Thus, the shot pattern 26b is shifted one-chip rightward from the position illustrated in FIG. 6A. This allows the boundary between the first pattern and the second region to be located in the scribe pattern 16b without the monitor patterns 17 formed therein. On the other hand, when the shot pattern 26a is arranged as illustrated in FIG. 6A, the boundary between the first pattern and the second region is located in the scribe pattern 16b without the monitor patterns 17 formed therein. Thus, the shot pattern 26a is not shifted.

As illustrated in FIG. 8B, the first regions 28a and 28b in the shot patterns 26a and 26b are then shielded by the blind 56. The focus condition is detected at the sensed points 24 within the shot patterns 26a and 26b. Focusing and leveling are performed. As illustrated in FIG. 8C, the blind 56 shields the first regions 28a and 28b in the shot patterns 26a and 26b from light. The exposure is performed in the above described state.

Figure 9A:
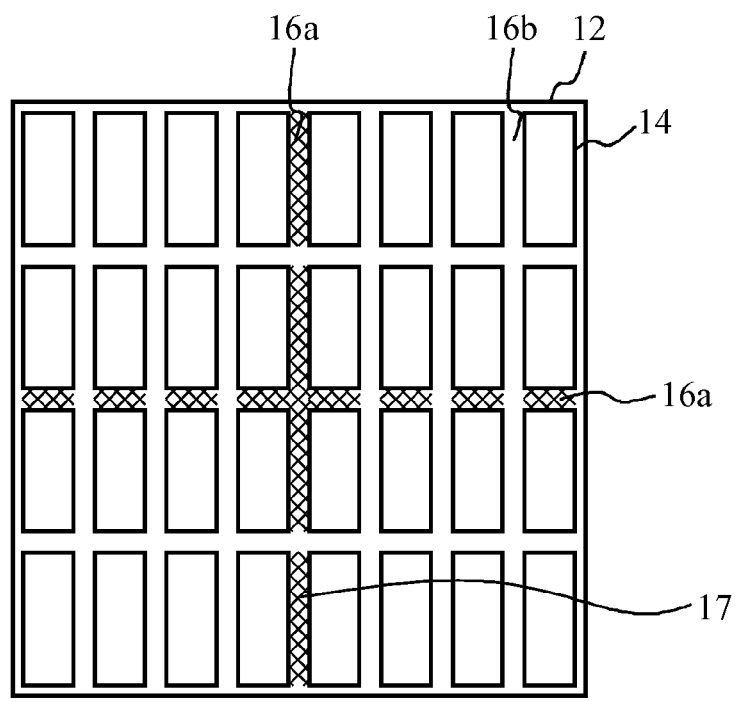
FIG. 9A and FIG. 9B illustrate other exemplary shot patterns.
Figure 9B:
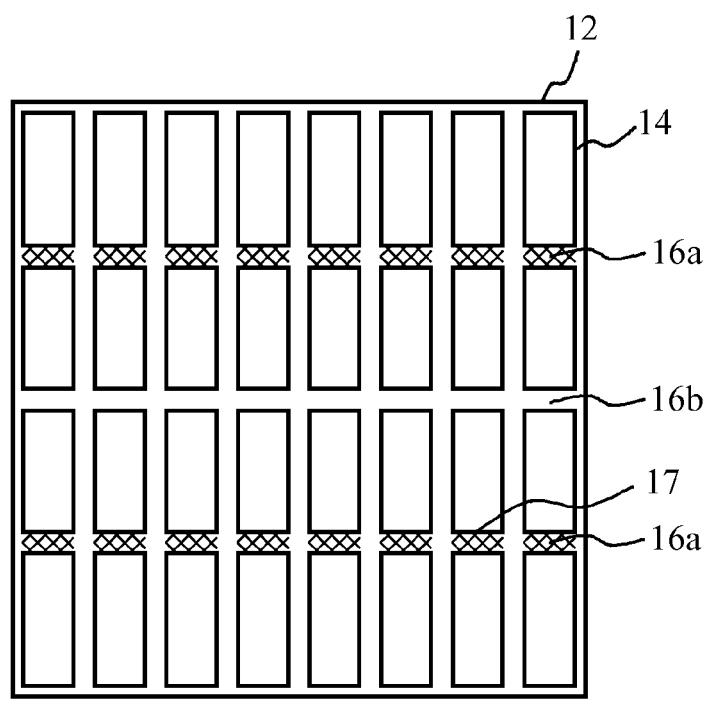

FIG. 9A and FIG. 9B illustrate other exemplary shot patterns. As illustrated in FIG. 9A and FIG. 9B, the scribe pattern 16a with the monitor patterns 17 formed therein and the scribe pattern 16b without the monitor patterns 17 formed therein may be arranged arbitrarily.

Figure 10:
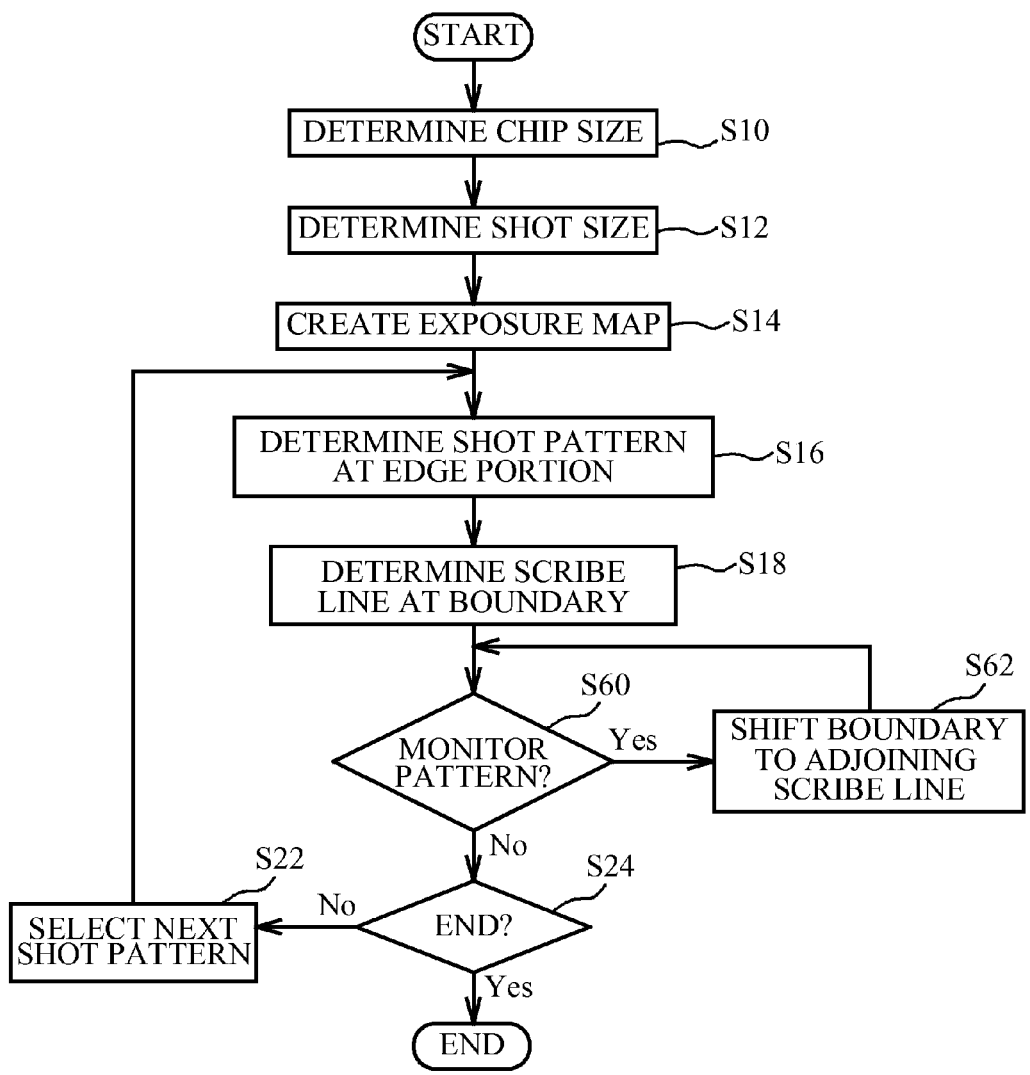
FIG. 10 is a flowchart illustrating a process for creating an exposure recipe of the first variation of the first embodiment.
Figure 11:
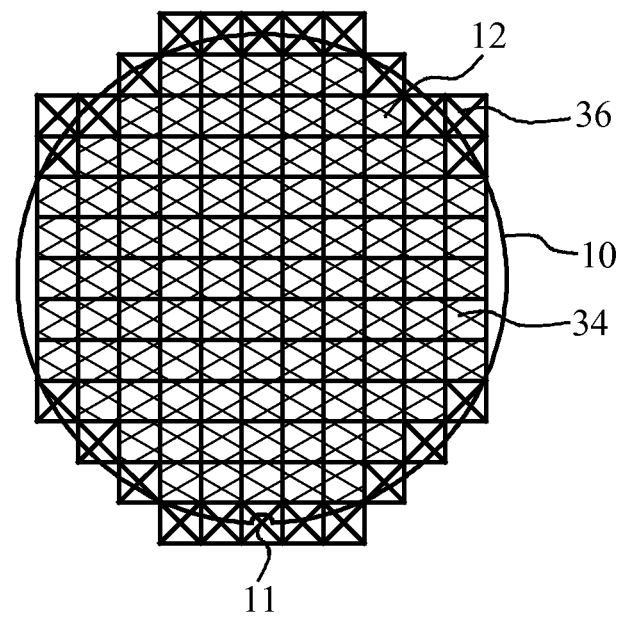
FIG. 11 is a diagram illustrating a map in the wafer.

FIG. 10 is a flowchart illustrating a process for creating an exposure recipe of the first variation of the first embodiment. FIG. 11 is a diagram illustrating a map in the wafer. As illustrated in FIG. 10, a chip sin is determined (step S10). A shot size is then determined (step S12). An arrangement of the first patterns is created as an exposure map (step S14). As illustrated in FIG. 11, the shot patterns 12 having all sensed points within the effective region are arranged in the wafer 10. A first pattern 34 (illustrated by cross-hatching) is formed in the wafer 10 so that the shot patterns 12 arranged in the X direction and the Y direction do not over lap each other and the chip patterns are arranged at regular intervals.

Back to FIG. 10, determined is a shot pattern at the edge portion at which the shot pattern 12 is shifted (step S16). As illustrated in FIG. 11, the shot patterns 12 that are located outside the first pattern 34 and have the chip patterns 14 within the effective region 20 are determined as shot patterns 36 at the edge portion (illustrated with X-mark).

Back to FIG. 10, a scribe patterns at a boundary is determined (step S18). As with the shot pattern 26b shifted seven-chip leftward as illustrated in FIG. 6A, determined is the scribe pattern in which the boundary between the first pattern 34 and the second region is to be located.

It is determined whether the determined scribe pattern is a scribe pattern with a monitor pattern formed therein (step S60). When the determination is Yes, the boundary is shifted so as to be located in an adjoining scribe pattern (step S62), and the process goes back to step S60. When the determination at step S60 is No, the process moves to step S24. In the case of FIG. 6A and FIG. 7, the determined scribe pattern 16 is the scribe pattern 16a with the monitor pattern 17 formed therein. Thus, the determination at step S60 becomes Yes. At step S62, the shot pattern 26b is shifted one-chip rightward as illustrated in FIG. 8A. As illustrated in FIG. 8A and FIG. 7, the determined scribe pattern 16 is the scribe pattern 16b without the monitor patterns 17 formed therein. Thus, the determination at step S60 becomes No.

It is determined whether determined are all the scribe patterns 16 in which the boundaries of the shot patterns 36 at the edge portion are to be located (step S24). In a case of Yes, the process ends. In a case of No, the next shot pattern 36 at the edge portion is selected (step S22), and the process goes back to step S16. As described above, the scribe patterns 16 in which the boundaries of the shot patterns 36 at the edge portion are to be located are determined.

Figure 12A:
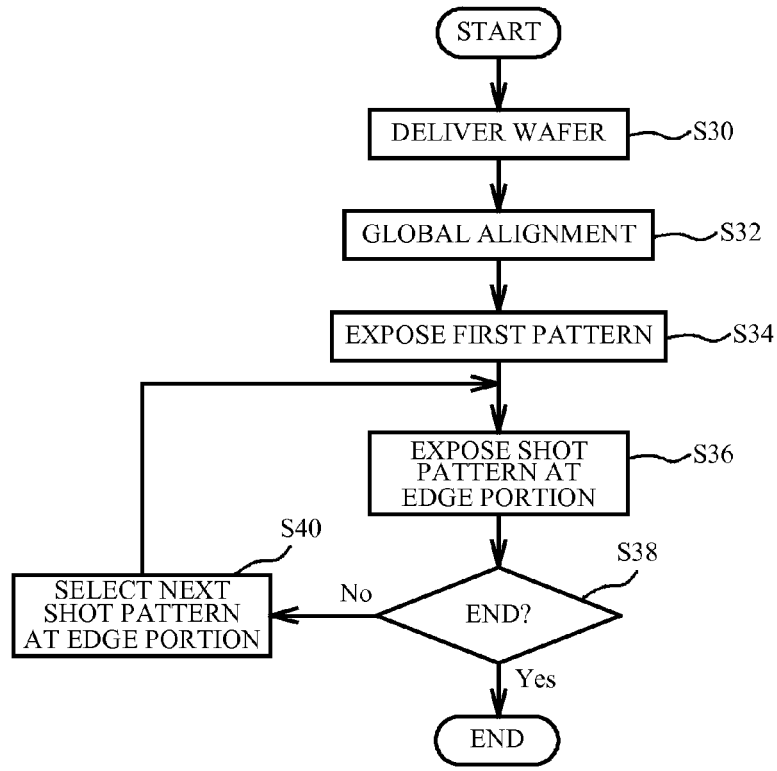
FIG. 12A and FIG. 12B are flowcharts illustrating a process executed by the exposure apparatus of the first variation of the first embodiment.
Figure 12B:
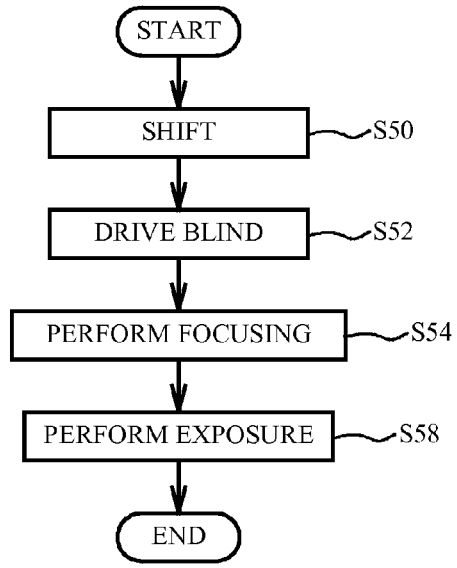

FIG. 12A and FIG. 12B are flowcharts illustrating a process executed by an exposure apparatus of the first variation of the first embodiment. FIG. 12B is a flowchart illustrating a detail of step S36 in FIG. 12A. As illustrated in FIG. 12A, the controller 74 controls a wafer delivery mechanism to deliver a wafer to the wafer stage 68 (step S30). The controller 74 controls an alignment mechanism to perform global alignment (step S32). The global alignment is an alignment performed to ten wafers together as a unit.

The controller 74 controls an exposure unit to expose the first pattern (step S34). The controller 74 controls the wafer stage 68 to shift with respect to each shot pattern 12 in the first pattern 34 in FIG. 11. The controller 74 controls an adjustment unit to perform focusing and leveling of the wafer stage 68 in accordance with the focus condition of the sensed points 24. The controller 74 controls the exposure unit to expose the shot pattern 12.

The controller 74 controls the exposure unit to expose one of the shot patterns 36 at the edge portion (step S36). The controller 74 determines whether the process ends (step S38). For example, when all the shot patterns 36 at the edge portion are exposed, the determination becomes Yes, and the process ends. In a case of No, the process goes back to step S36 to expose the next shot pattern at the edge portion selected at step S40.

As illustrated in FIG. 12B, at step S36, the controller 74 controls the wafer stage 68 to shift the shot pattern 26a or 26b as illustrated in FIG. 8A (step S50). As illustrated in FIG. 8B, the controller 74 then drives the blind 56 (step S52). The controller 74 controls the adjustment unit to perform focusing based on a detection result of a focus condition detected at least a part of the sensed points 24 (step S54). As illustrated in FIG. 8C, the controller 74 performs exposure in this state (step S58). Then, this process is ended, and goes back to step S38 in FIG. 12A.

Figure 13A:
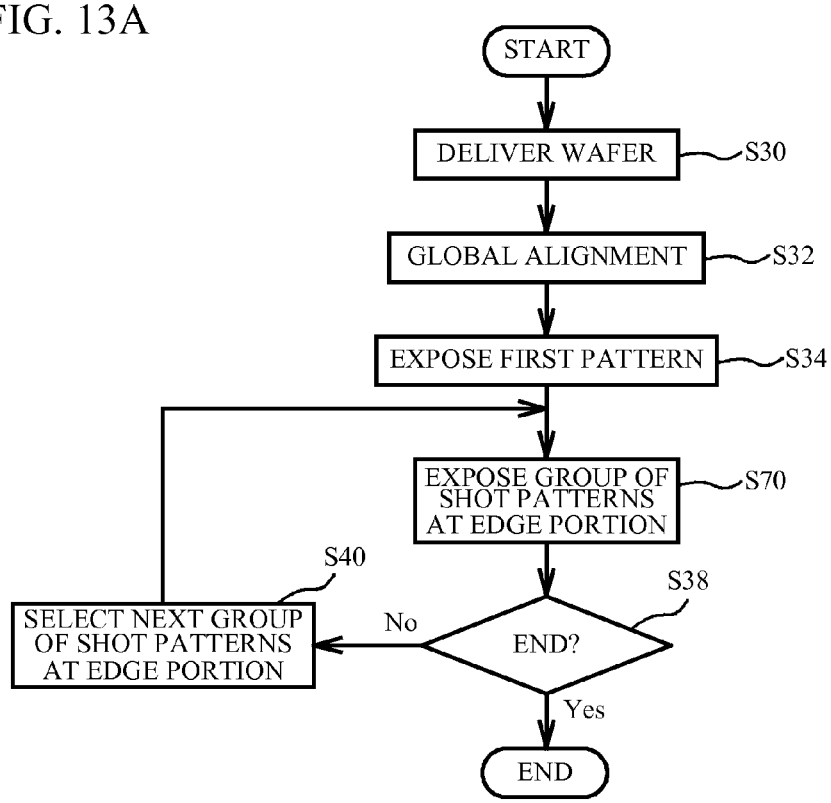
FIG. 13A and FIG. 13B are flowcharts illustrating a process executed by an exposure apparatus of a second variation of the first embodiment.
Figure 13B:
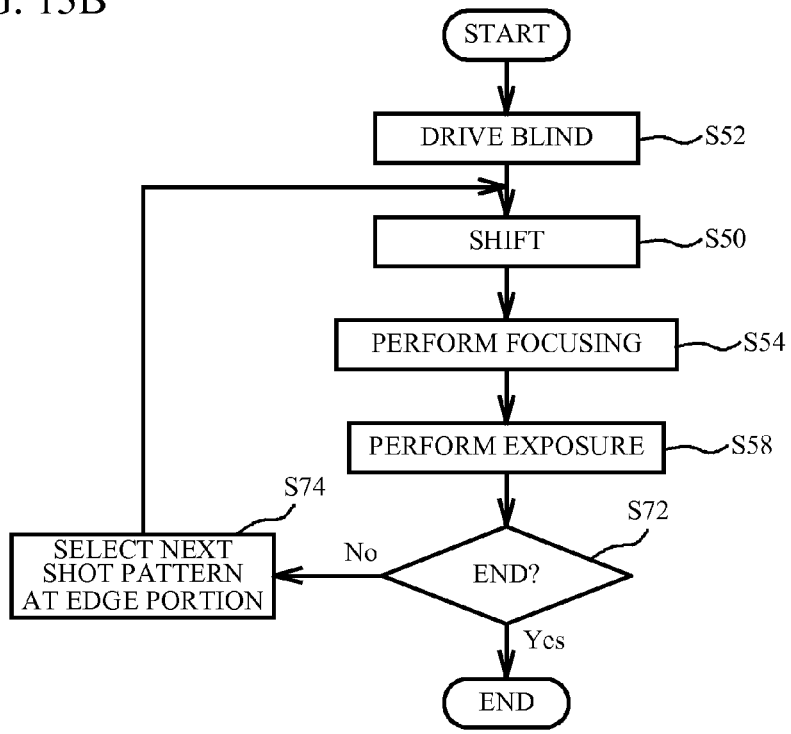

FIG. 13A and FIG. 13B are flowcharts illustrating a process executed by an exposure apparatus of a second variation of the first embodiment. FIG. 13B is a flowchart illustrating a detail of step S70 in FIG. 13A. As illustrated in FIG. 13A, after the first pattern is exposed (step S34), the controller 74 controls the exposure unit to expose a group of shot patterns at the edge portion (step S70). The group of shot patterns is formed by grouping the shot patterns 36 to be exposed with the same blind arrangement. The controller 74 determines whether the process ends (step S38). In a case of Yes, the process ends. In a case of No, the process goes back to step S70 to expose a next group of shot patterns at the edge portion selected in step S40 with a next blind arrangement. Other steps are the same as those in FIG. 12A, and thus a description thereof is omitted.

As illustrated in FIG. 13B, the controller 74 drives the blind 56 (step S52). The controller 74 controls the wafer stage 68 to shift (step S50). The controller 74 controls the adjustment unit to perform focusing (step S54). The controller 74 controls the exposure unit to perform exposure (step S58). The controller 74 determines whether the process ends. In a case of Yes, the process goes back to step S38 in FIG. 13A. In a case of No, the controller 74 controls the wafer stage 68 to shift to the next shot pattern at the edge portion selected at step S74, and goes back to step S50 to control the exposure unit to perform exposure.

As described above, the second variation of the first embodiment exposes the shot patterns to be exposed with the same blind arrangement continuously. The second variation of the first embodiment is effective when it takes time to move the blind 56 more than to move the wafer stage 68.

The first embodiment and its variations use the photomask having the shot pattern 12 including the chip patterns 14 arranged as illustrated in FIG. 2B. As described at step S34 in FIG. 12A, the shot patterns 12 are exposed onto the wafer 10 as the first pattern 34. As illustrated in FIG. 6A and FIG. 8A, the photomask is aligned on the wafer so that the chip patterns 14 are continuously arranged at regular intervals in the first pattern 34 and the second region other than the first region 28a or 28b. At this time, the first region 28a or 28b of the shot pattern 26a or 26b is made to overlap the first pattern 34, and the second region other than the first region in the shot pattern 26a or 26b is made to be outside the first pattern 34. As illustrated in FIG. 6B and FIG. 8B, the focus on the wafer 10 is adjusted. As illustrated in FIG. 6C and FIG. 8C, the first region 28a or 28b is shielded from light, and the pattern of the second region is exposed onto the wafer 10 as a second pattern.

The above process can improve focusing accuracy because the focus condition is detected within the effective region even at the edge portion of the wafer.

In addition, as illustrated in FIG. 2B, the photomask includes the scribe patterns 16 between the chip patterns 14. As illustrated in FIG. 6A and FIG. 8B, the boundary between the first region and the second region is located in the scribe pattern 16. This allows the scribe patterns 16 to reduce the pattern displacement caused by two-time exposure.

Furthermore, as illustrated in FIG. 7 of the first variation oldie first embodiment, the scribe pattern 16 includes the first scribe pattern 16a with the monitor patterns 17 formed therein and the second scribe pattern 16b without the monitor pattern 17 formed therein. As illustrated in FIG. 8A, the boundary between the first region and the second region is located in the second scribe pattern 16b. This suppresses the pattern displacement caused by two-time exposure at the monitor patterns.

The second variation of the first embodiment executes the following steps to the shot patterns having first regions with identical shapes instead of steps S50 to S56 for driving the blind to block the light in FIG. 13B. The photomask is aligned on the wafer. Then, focus on the wafer is adjusted, and the first region is shielded from light. The pattern of the second region is then exposed onto the wafer as the second pattern. The above process can reduce the exposure time when it takes time to move the blind 56 more than to move the wafer stage 68.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:

1. An exposure method comprising:
    exposing, with a photomask including a shot pattern including chip patterns arranged therein, a plurality of shot patterns onto a wafer as a first pattern, each of the plurality of shot patterns corresponding to the shot pattern;
    aligning the photomask on the wafer so that a first region of the shot pattern overlaps the first pattern, a second region other than the first region of the shot pattern is outside the first pattern, and the chip patterns are continuously arranged in the first pattern and the second region after the step of exposing the plurality of shot patterns;
    adjusting focus on the wafer, with the photomask having been aligned on the wafer after the step of aligning the photomask; and
    shielding the first region from light and exposing a pattern of the second region onto the wafer as a second pattern after the step of adjusting the focus,
    wherein:
    the photomask includes a first scribe pattern with a monitor pattern formed therein and a second scribe pattern without the monitor pattern formed therein;
    the first scribe pattern and the second scribe pattern are located between the chip patterns of the photomask;
    a first single second scribe pattern among the second scribe pattern extends from one periphery of the photomask to the other periphery of the photomask in the horizontal direction;
    a second single second scribe pattern among the second scribe pattern extends from one periphery of the photomask to the other periphery of the photomask in the vertical direction; and
    an entire boundary between the first region and the second region is located in the first single second scribe pattern and the second single second scribe pattern.

2. The exposure method according to claim 1, wherein the aligning the photomask on the wafer, the adjusting the focus on the wafer, the shielding the first region from light and the exposing the pattern of the second region onto the wafer as the second pattern are sequentially performed to shot patterns including the first regions with identical shapes while an arrangement of a blind shielding the first region from the light is maintained.

3. The exposure method according to claim 1, wherein the chip patterns are identical chip patterns, and the chip patterns are arranged in at least one of a first direction and a second direction intersecting with the first direction in the shot pattern.

4. The exposure method according to claim 1, wherein the first pattern is exposed onto the wafer so that a plurality of the shot patterns arranged in a first direction and a second direction intersecting with the first direction do not overlap each other and the chip patterns are arranged at regular intervals.

5. The exposure method according to claim 1, wherein the second region includes a chip pattern within an effective region of the wafer.

6. The exposure method according to claim 5, wherein the first region includes a chip pattern within the effective region.

7. An exposure apparatus comprising:
    an exposure unit that exposes a pattern onto a wafer with a photomask including a shot pattern including chip patterns arranged therein;
    an adjustment unit that adjusts focus on the wafer; and
    a controller that controls the exposure unit to expose a plurality of shot patterns onto the wafer as a first pattern, each of the plurality of shot patterns corresponding to the shot pattern, the adjustment unit to adjust the focus after the exposure unit exposes the plurality of shot patterns, with the photomask having been aligned on the wafer, so that a first region of the shot pattern overlaps the first pattern, a second region other than the first region of the shot pattern is outside the first pattern, and the chip patterns are continuously arranged in the first pattern and the second region, and the exposure unit to shield the first region from light and expose a pattern of the second region onto the wafer as a second pattern after the adjustment unit adjusts the focus,
    wherein:
    the photomask includes a first scribe pattern with a monitor pattern formed therein and a second scribe pattern without the monitor pattern formed therein;
    the first scribe pattern and the second scribe pattern are located between the chip patterns of the photomask;
    a first single second scribe pattern among the second scribe pattern extends from one periphery of the photomask to the other periphery of the photomask in the horizontal direction;
    a second single second scribe pattern among the second scribe pattern extends from one periphery of the photomask to the other periphery of the photomask in the vertical direction; and
    an entire boundary between the first region and the second region is located in the first single second scribe pattern and the second single second scribe pattern.

8. The exposure apparatus according to claim 7, wherein the controller sequentially controls the adjustment unit to align the photomask on the wafer and to adjust of the focus on the wafer, and the exposure unit to shield the first region from light and to expose the pattern of the second region onto the wafer as the second pattern to shot patterns including the first regions with identical shapes while an arrangement of a blind shielding the first region from the light is maintained.

* * * * *